(12) United States Patent
Guo

(10) Patent No.: US 12,154,770 B2
(45) Date of Patent: *Nov. 26, 2024

(54) VACUUM DEPOSITION INTO TRENCHES AND VIAS

(71) Applicant: Ascentool, Inc., Palo Alto, CA (US)

(72) Inventor: George Xinsheng Guo, Palo Alto, CA (US)

(73) Assignee: Ascentool, Inc., Palo Alto, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/346,967

(22) Filed: Jul. 5, 2023

(65) Prior Publication Data

US 2024/0021421 A1 Jan. 18, 2024

Related U.S. Application Data

(60) Provisional application No. 63/368,231, filed on Jul. 12, 2022.

(51) Int. Cl.
*H01J 37/34* (2006.01)
*H01J 37/32* (2006.01)

(52) U.S. Cl.
CPC .... *H01J 37/3405* (2013.01); *H01J 37/32669* (2013.01); *H01J 37/3447* (2013.01); *H01J 37/3452* (2013.01); *H01J 37/3455* (2013.01); *H01J 37/3461* (2013.01)

(58) Field of Classification Search
CPC ............. H01J 37/3405; H01J 37/32669; H01J 37/3447; H01J 37/3452; H01J 37/3455; H01J 37/3461; H01J 37/345
USPC ................................................... 204/298.11
See application file for complete search history.

(56) References Cited

U.S. PATENT DOCUMENTS

| 5,114,556 | A | * | 5/1992 | Lamont, Jr. | ......... H01L 21/0217 |
| | | | | | 257/E21.585 |
| 5,433,835 | A | | 7/1995 | Demaray | |
| 5,814,196 | A | | 9/1998 | Hollars | |
| 2004/0000478 | A1 | * | 1/2004 | Guenzer | ............ H01J 37/3405 |
| | | | | | 204/298.18 |

(Continued)

FOREIGN PATENT DOCUMENTS

| JP | 61-204371 | * | 9/1986 |
| JP | 01-201467 | * | 8/1989 |
| JP | 03-170669 | * | 7/1991 |

(Continued)

OTHER PUBLICATIONS

Machine Translation JP 61-204371 (Year: 1986).*

(Continued)

*Primary Examiner* — Rodney G McDonald
(74) *Attorney, Agent, or Firm* — SV Patent Service

(57) ABSTRACT

A plasma deposition apparatus includes a first plasma source that can produce a plasma confined in a magnetic field. The first plasma source includes a closed-loop electrode defining a center region therein and a central axis through the central region, and one or more magnets that are outside an inner surface of the closed-loop electrode. The magnets can produce a magnetic field in the center region. The one or more magnets can be at least partially embedded in the closed-loop electrode. The closed-loop electrode and the magnets can produce a plasma of ions to sputter atoms off a sputtering target or a backing plate.

19 Claims, 16 Drawing Sheets

(56) References Cited

U.S. PATENT DOCUMENTS

2007/0045108 A1    3/2007   Demaray

FOREIGN PATENT DOCUMENTS

| | | | |
|---|---|---|---|
| JP | 04-048071 | * | 2/1992 |
| JP | 06-128739 | * | 5/1994 |
| JP | 2001-81550 | * | 3/2001 |
| WO | WO88/02546 | * | 7/1988 |

OTHER PUBLICATIONS

Machine Translation JP 06-128739 (Year: 1994).*
Machine Translation JP 2001-81550 (Year: 2001).*
Machine Translation JP 01-201467 (Year: 1989).*
Machine Translation JP 03-170669 (Year: 1991).*
Machine Translation WO 88/02546 (Year: 1988).*
Machine Translation JP 04-048071 (Year: 1992).*

* cited by examiner

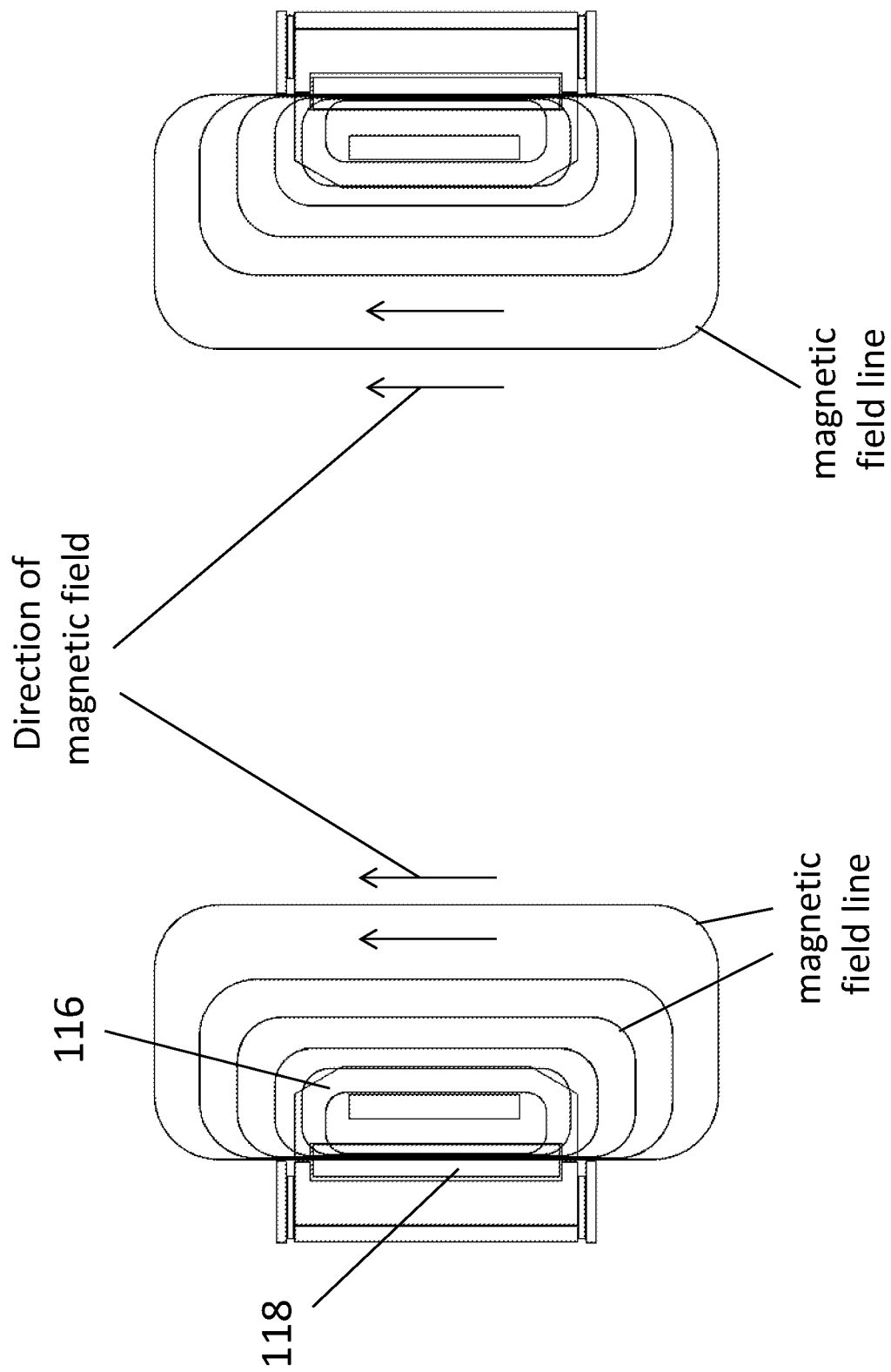

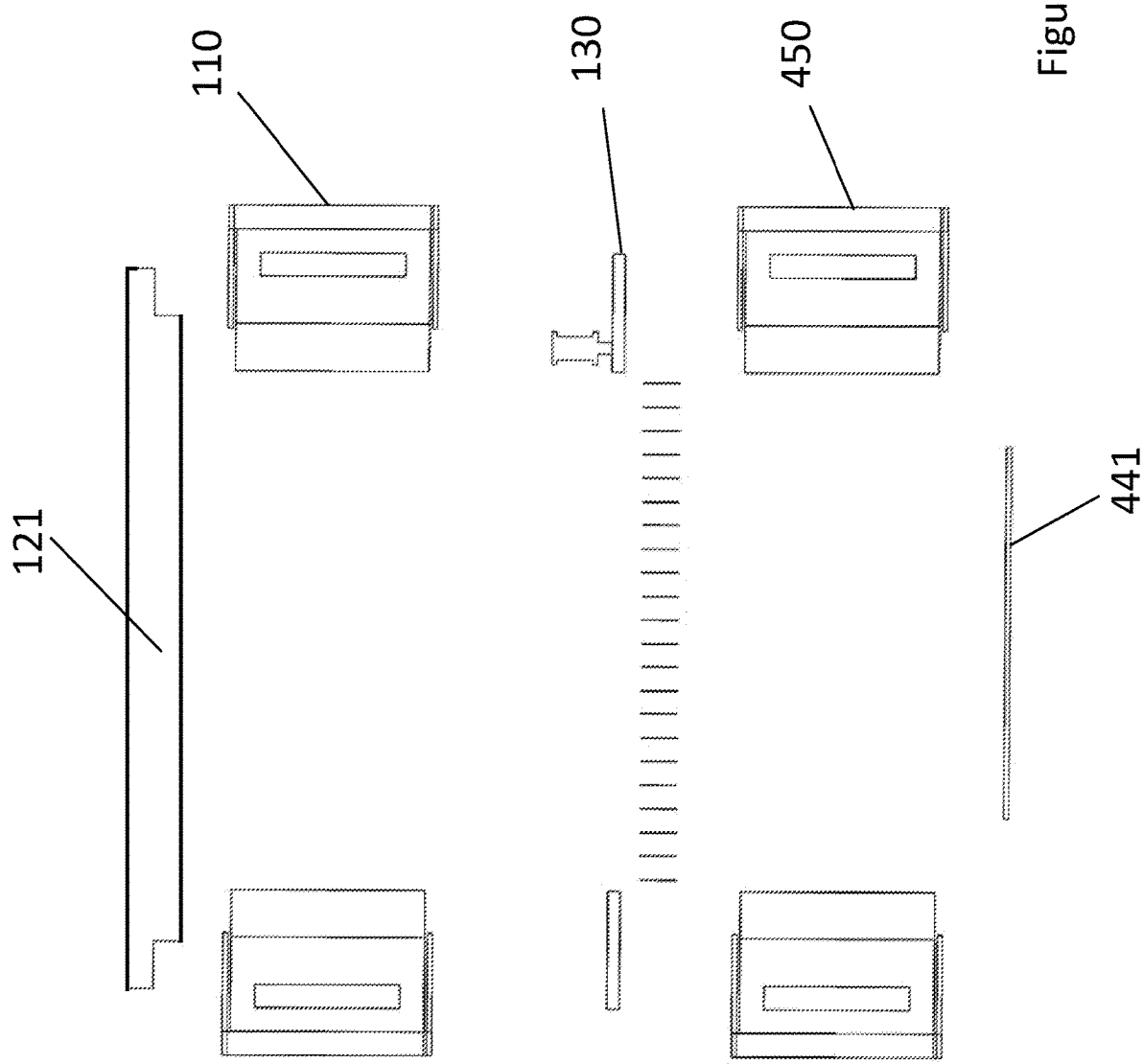

VACUUM DEPOSITION INTO TRENCHES AND VIAS

BACKGROUND OF THE INVENTION

The present application relates to material deposition technologies, and more specifically sputtering deposition on high aspect ratio semiconductor substrates.

Material depositions such as sputtering, chemical vapor deposition (CVD), and plasma enhanced CVD (PECVD) are widely used in semiconductor manufacturing. As the feature sizes of the devices get smaller over time, it becomes more difficult to deposit materials into the bottom of the devices such as trenches and via. Some applications require thick material at bottom of trenches and via while having little or no materials on sidewalls. Some other applications require more conformal or uniform coating on sidewalls while having little materials on the bottom of trenches and via.

To achieve deposition uniformity, the deposition sources are typically larger than the substrate. The angular distribution of the deposition atoms or ions is broad. The broad distribution can deposit more material at upper portion of sidewalls of trenches and via and pinch off the upper entrance of the trenches and via, preventing further deposition into trenches and via. It is desirable to ionize almost 100% of deposition atoms and form a parallel ion beam; or to block off the larger off-angle deposition atoms if 100% ionization is not possible.

The atoms or ions to be deposited must have strong directionality when they reach the wafer surfaces during deposition. Various ways of ionizing atoms and accelerating these ions to substrates can produce variable degrees of directionality, but all require low pressure operation to avoid gas scattering. The ions and atoms that collide with residue process gases before they reach the substrate surface increase the divergence angles of these ions and atoms. Lower pressure keeps the directionality of ions and atoms; increases deposition into the trenches and via; and enhances sputter etch or reactive etch of the trenches and via if needed.

In some applications, it is desirable to coat materials on the sidewalls of the trenches and via, leaving little film on the bottom of trenches or via. In some other applications, it is desirable to only coat the materials at the bottom of trenches and via, leaving little or no film on the sidewalls of the trenches and via. A precisely controlled parallel ion beam that can tilt in angle relative to the substrate is needed to either deposit film or etch the deposited film.

SUMMARY OF THE INVENTION

We have invented a plasma source that eliminates most of the electron leakage from the plasma source. The termination of plasma next to the anode or ground is improved to further reduce the loss of electrons. The plasma is extended further from the cathode or anode and more uniform plasma is achieved. The improved plasma greatly enhances the plasma density and lowers the operating pressure.

We also disclosed a method to provide uniform depositing atoms into the ionization plasma and achieve good deposition uniformity on substrate.

We invented a collimation apparatus that can block deposition in broad angles, accelerate ions and focus ions, tilt the direction of the accelerated ions, and rotate the accelerated ions. The collimation apparatus can limit the deposition on itself and reduce process drift, particulates formations, and shadowing of the substrate. The disclosed collimation apparatus and the method to use this apparatus improve the deposition and etch into high aspect ratio structures such as trenches and via on the substrate.

In some cases, the energetic ions can sputter the substrate and cause re-sputtering into the trenches or via and cause clogging. Lower ion velocity or lower substrate bias is desirable. We disclose a way to reduce this voltage and still maintain the directionality of the ions coming to the substrate. For some applications, electro-static chucks (ESC or E-chuck) are powered by RF power to induce a voltage called self-bias voltage; this voltage requires plasma near the substrate and may be high due to the high power needed for process equipment throughput, low plasma density near the substrate, or geometry of various electrodes near the substrate. We disclosed ways to control this self-bias voltage and independent control of the self-bias voltage and ion current.

In one general aspect, the present invention relates to a plasma deposition apparatus that includes a first plasma source configured to produce a plasma confined in a magnetic field that includes a closed-loop electrode defining a center region therein and a central axis through the central region and one or more magnets that are outside an inner surface of the closed-loop electrode, wherein the one or more magnets are configured to produce the magnetic field in the center region, wherein the closed-loop electrode and the one or more magnets can produce a plasma of ions to sputter atoms off a sputtering target or a backing plate; and a collimator that includes a first set of parallel ribbons having surfaces substantially parallel to the central axis, and a second set of parallel ribbons having surfaces substantially parallel to the central axis. The second set of parallel ribbons can be displaced from the first set of parallel ribbons along the central axis, wherein the first set of parallel ribbons and the second set of parallel ribbons are crossed at a substantial angle. The first set of parallel ribbons and the second set of parallel ribbons can collimate the atoms and ions produced by the first plasma source and direct the ions to a substrate.

Implementations of the system may include one or more of the following. The closed-loop electrode can have a circular shape or a polygon shape. The first plasma source can be disposed between the sputtering target and the substrate; the plasma deposition apparatus can further include a magnetron positioned adjacent to a side of the sputtering target away from the substrate. The magnetron can be rotated by a rotation mechanism. The one or more magnets can be positioned in a circle in the closed-loop electrode. The one or more magnets can be fully embedded in the closed-loop electrode. The one or more magnets are partially embedded in the closed-loop electrode. The sputtering target can be electrically biased relative to ground. The first set of parallel ribbons and the second set of parallel ribbons can be crossed substantially at an orthogonal angle. The first set of parallel ribbons and the second set of parallel ribbons can be electrically biased relative to each other to steer the ions. Neighboring ribbons in the first set of parallel ribbons and the second set of parallel ribbons can be electrically biased relative to each other to steer the ions. The first plasma source can be disposed between the sputtering target and the substrate, wherein the collimator can be disposed between the first plasma source and the substrate. The first set of parallel ribbons can be moveable by a first transport mechanism. The second set of parallel ribbons can be moveable by a second transport mechanism. The first plasma source can further include an electrical coil configured to increase uniformity of the magnetic field in the center region. The plasma deposition apparatus can further include a second plasma source disposed between the collimator and the substrate, configured to neutralize ions in the first plasma.

In another general aspect, the present invention relates to a plasma deposition apparatus that includes a first plasma source that can produce a plasma confined in a magnetic field that includes a closed-loop electrode defining a center region therein and a central axis through the central region, and one or more magnets that are outside an inner surface of the closed-loop electrode. The one or more magnets can produce the magnetic field in the center region. The one or more magnets can be at least partially embedded in the closed-loop electrode. The closed-loop electrode and the one or more magnets can produce a plasma of ions to sputter atoms off a sputtering target or a backing plate.

BRIEF DESCRIPTION OF DRAWINGS

FIGS. 3C and 3D show the magnetic field illustration of the high-density plasma source in FIGS. 3A and 3B, and with an electrical magnet to extend the magnet field to the center of the process chamber. A vacuum chamber envelope is not shown for visual clarity.

FIG. 4 illustrates how an additional plasma source can create a plasma necessary for electro-static chuck to form self-bias voltage on a substrate in the vacuum deposition system in accordance with the present invention. The view is similar to FIG. 1D, with additional plasma source.

DETAILED DESCRIPTION OF THE INVENTION

Figure 1A:
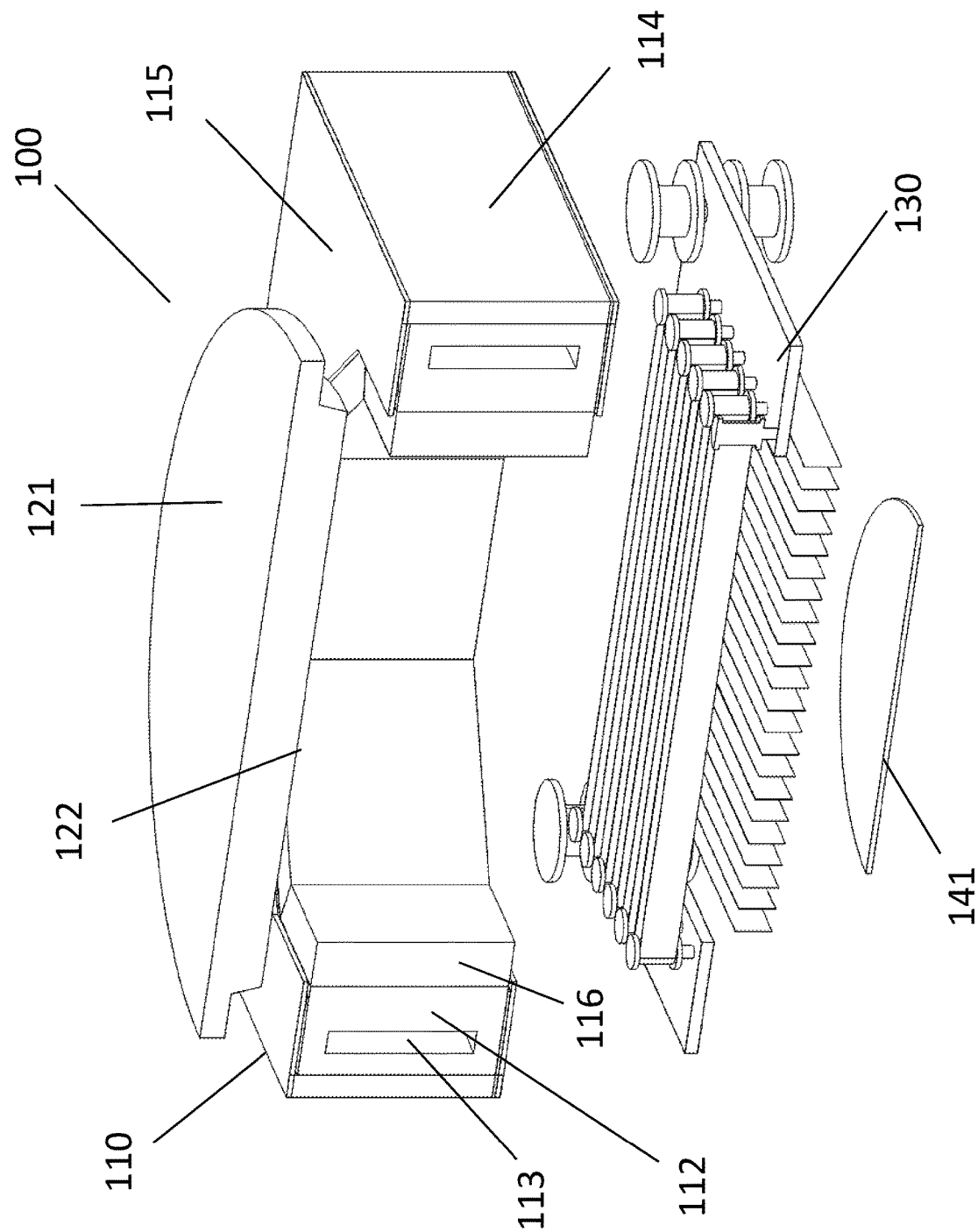
FIG. 1A is a perspective view of a plasma deposition apparatus that includes a substrate being deposited by sputtering target, a three-dimensional closed-loop magnetron source as secondary plasma sources, and a collimator in accordance with the present invention.
Figure 1B:
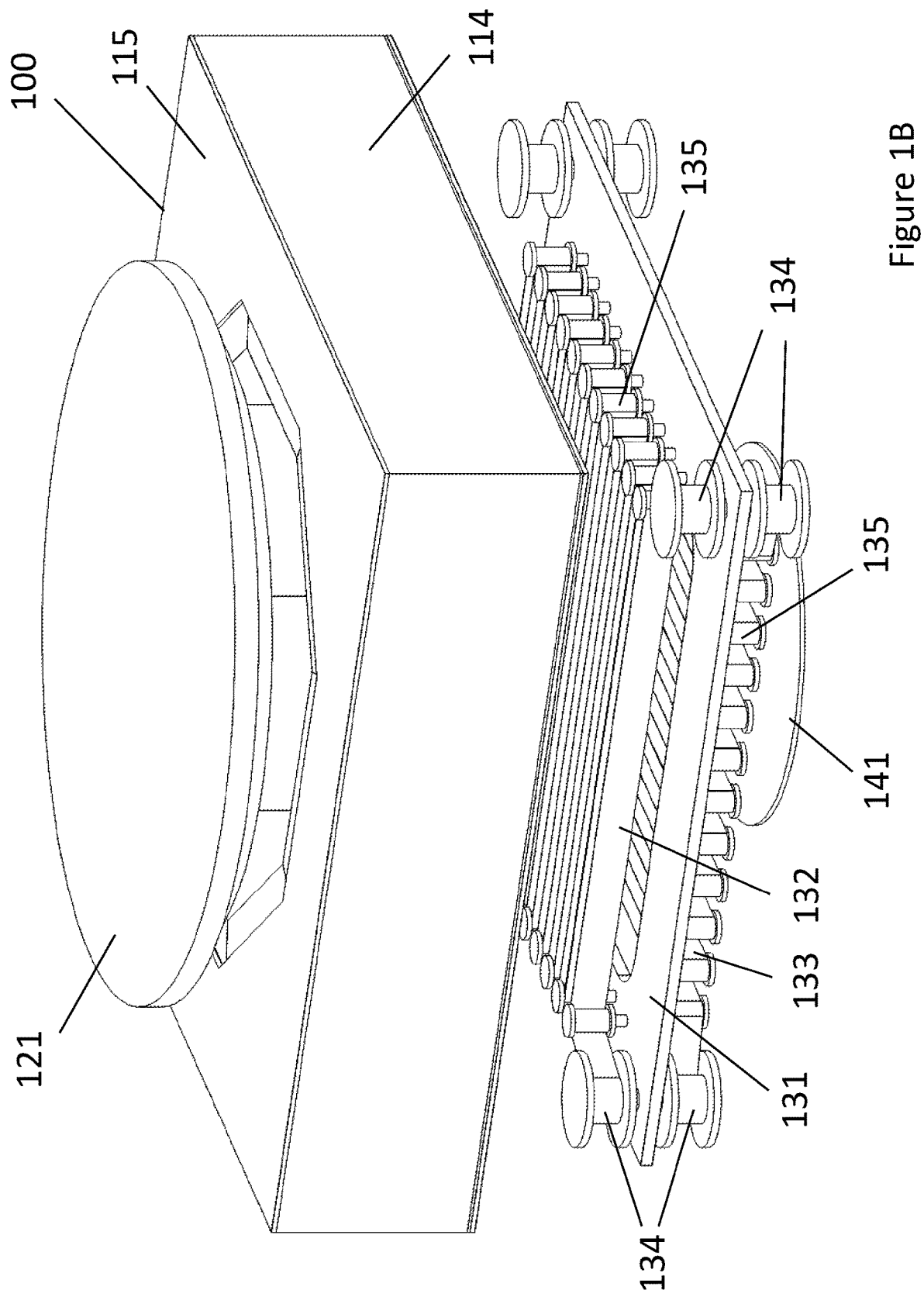
FIG. 1B is a sectional perspective view of the plasma deposition apparatus shown in FIG. 1A.

In order to send ions or atoms to the bottom of trenches or via, either perpendicular to substrate surface, or at a predetermined angle to the substrate center axis, the ions or atoms that travel at a larger angle off the substrate center axis have to be eliminated or greatly reduced. Deposition from larger off-axis angle ions and atoms preferentially deposit at upper portion of trench sidewalls and narrow the entrance of the trenches or via (pinching) and prevent subsequent void-free filling of the trench and via. Ions or atoms should form a substantially parallel beam either perpendicular to the substrate surface or at a predetermined angle in order to reach the bottom of trenches or the side walls of trenches.

FIGS. 1A-1D show a plasma deposition apparatus 100 where a collimator is placed between plasma sources and the substrate. The collimation device is a mechanical device that physically blocks off ions or atoms that hit the device and only allows ions and atoms that travel in a narrow angle to pass. The primary plasma source can be a sputtering source where a sputtering target 121 is negatively biased relative to the ground and configured to sputter materials into the upper space above the collimator. In the present application, sputtering target is defined as any object that can be potentially biased against ground potential, even if many sputtering systems are sold without a target since customers chose these target later on. An optional secondary plasma source 110 is placed below the primary plasma source to further ionize the atoms coming off the sputtering target. Substrate 141 is biased by RF, AC or DC voltage and attracts the ions above and below the collimator to the substrate. The collimator assembly 130 collects most of the off-axis deposition on the ribbons 132 and 133 before they reach the substrate 141, while allowing the ions and atoms that are closely aligned with the axis of the collimator to pass through. The ribbons 132 and 133 are guided by rollers 135 to form parallel walls and can be tensioned and moved by motors or tension devices attached to un-winding and rewinding wheel 134. The movement can provide fresh ribbons after too much deposition. A mounting plate 131 supports all the rollers and wheel and is attached to the vacuum chamber. The secondary plasma source 110 can increase ionization power while keeping the deposition low in the primary source to ensure a high percentage of deposition atoms are ionized.

Figure 3A:
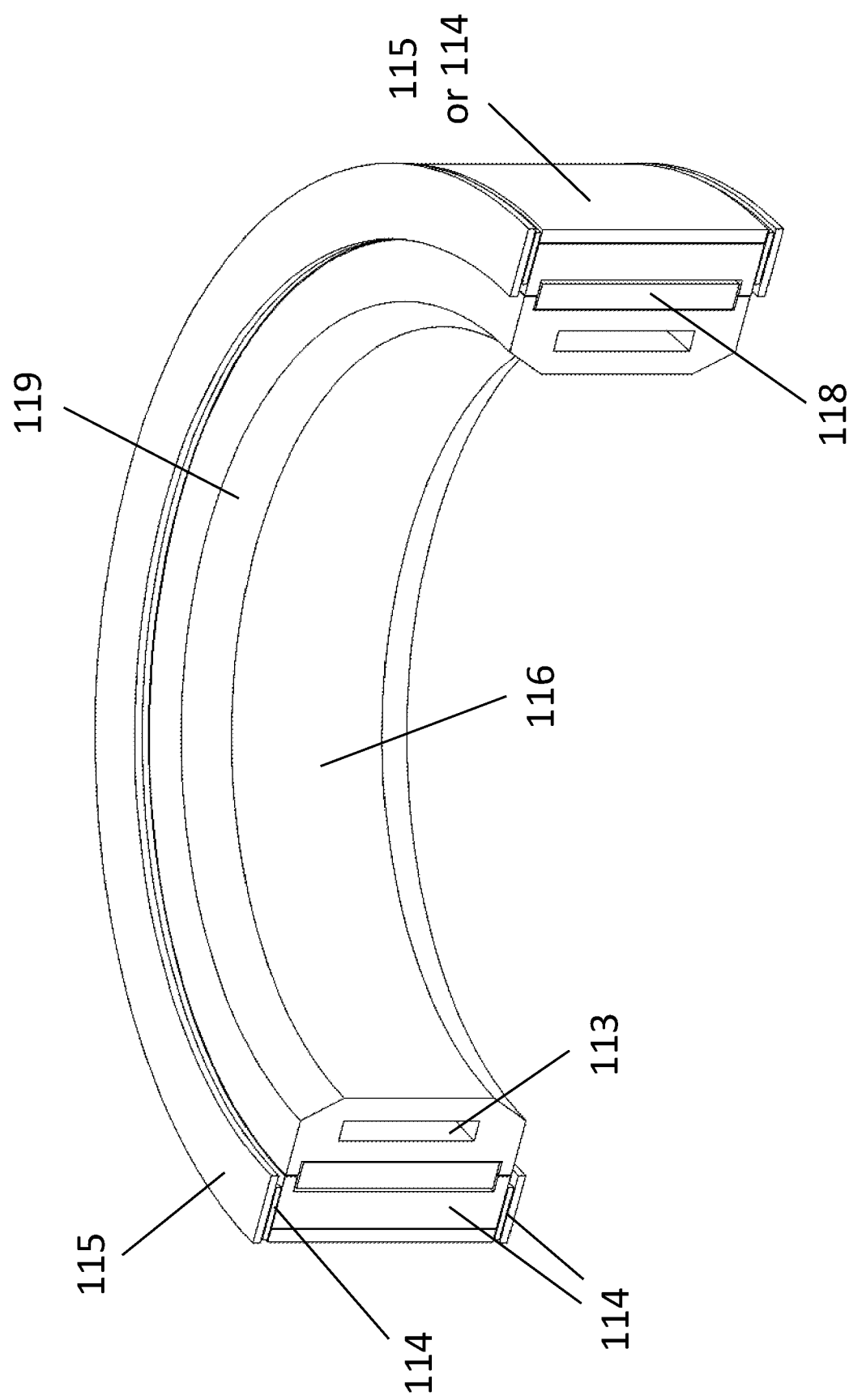
FIGS. 3A and 3B respectively show the perspective and sectional views of a high-density magnetron plasma source in the vacuum deposition system in accordance with the present invention.
Figure 3B:
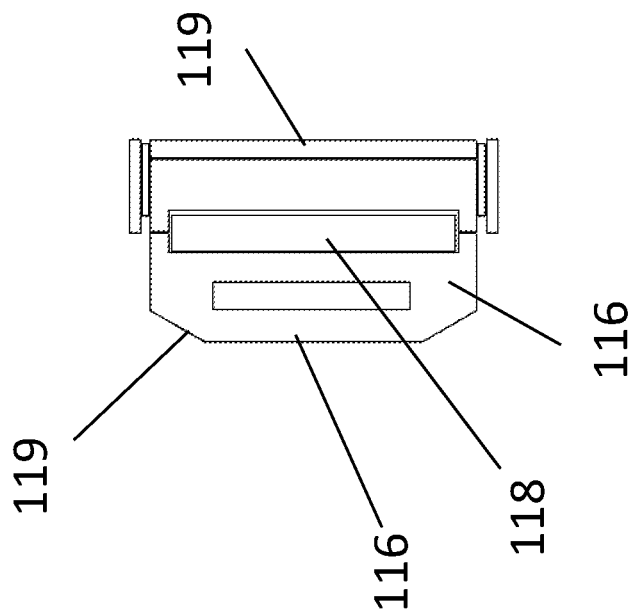
Figure 3B:
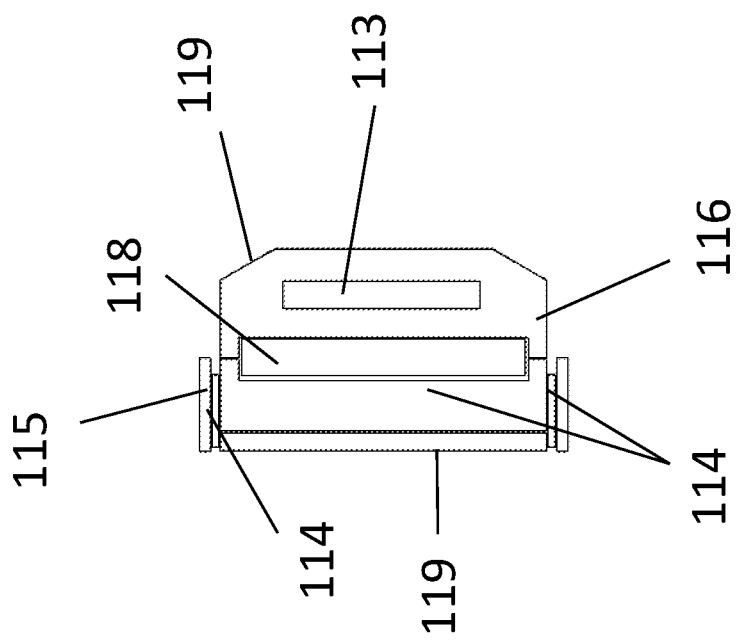

We have invented a magnetron plasma source that forms a closed loop magnetic field in three dimensions, as shown in FIGS. 1A, 1D, 3A and 3B. The permanent magnets 118 behind secondary electrodes 116 (most likely a cathode) form substantially parallel magnetic fields along the inner surfaces of the electrodes 116 of the secondary plasma source 110, and the magnets 118 form a closed loop. The top portion of the magnets 118 can have either the north or the south magnetic pole and the low portion has the opposite magnetic pole to its top portion. Once the electrodes 116 of the secondary plasma source are electrically biased, the electrons would be confined by the magnetic fields and hop along the surface of the secondary plasma source electrodes 116 to ionize the gases and sputtered atoms. The magnets 118 can be held in a liquid cooled backing plate 112 with liquid cooling channel 113. Alternatively, liquid cooling channel 113 and the magnets 118 can be inside an electrode 116 and backing plate is optional as shown in FIGS. 3A and 3B. The electrode 116 has a closed-loop shape, such as a circle or a polygon. The closed-loop shape of the electrode 116 defines a central region 150 therein and a central axis 151 through the central region and perpendicular to the closed loop (such as the circle and the polygon) of the electrode 11.

One major challenge is to have high plasma density and low operating pressure to increase ionization probability at low pressure to avoid gas phase scattering and maintain the parallel ion beam. Since it takes at least one collision between ion and the cathode to generate at least one electron, the generated electron must fly as long distance as possible to ionize one or more atoms that can strike the cathode and generate another electron in order to maintain the plasma. The longer the electron can fly, the lower the operating pressure. The key is to have the best electron confinement before the electron is lost. Our test shows a three-dimensional closed loop magnetically confined plasma greatly reduces the electrons that can follow the magnetic flux, escape from the confinement and enable much higher plasma density and much lower operating pressure (0.1 mTorr in DC mode and 0.02 mTorr using 13.56 MHz RF). A lower operating pressure would reduce the collisions by residue gases, improve the alignment of depositing ions or atoms, and reduce the percentage of inert gas ions that do not contribute to deposition but sputter the substrate surfaces. FIGS. 3A and 3B illustrate the electrode or the anode 119 to be in circular form to improve the plasma uniformity for circular substrates. The electrode 116 can be made of same material as sputtering target 121 or coated with the materials from the sputtering target 121 to reduce potential contamination.

The cross section of the cathode should be such that only single continuous plasma is formed, not multiple plasma regions that can have inconsistent power distribution. One way is to have taper, fillet, or cut 119 at corner of the electrode or cathode to ensure a smooth plasma transition. The cathode can be liquid cooled with cooling channel 113 and protected by insulators 114 and a shield 115 in the back and sides. Magnets 118 are generally permanent magnets and should be within the width of electrode 116. Better plasma confinement is achieved when part or whole magnet 118 is inside electrode 116. Magnets 118 are magnetized along the length to have a substantially parallel magnetic field along the inner surface of electrode 116. Magnet 118 can be a continuous piece or made up of individual pieces with or without gaps between them to form a closed loop magnetic field. The magnets 118 can be cylindrical shaped or rectangular blocks. FIG. 3C illustrates the magnetic field distribution of present invention, the partially embedded magnets 118 inside electrode 116 create a return path for magnetic field and electrons in plasma back to electrode 116 and improve the plasma confinement efficiency.

The cathode can be polygon shaped, or circular shaped. The cathode can be made of multiple sections to reduce the cost. The surface of cathode can be coated or anodized to minimize metal contamination or extend the lifetime of the cathode. The cathode can be powered by DC, AC, or RF power sources. In case of AC or RF, a DC bias can be applied to the cathode through a coil that prevents shorting the AC or RF power to the anode or DC power supply. A low DC or zero DC bias can prevent sputtering of the cathode and still maintain plasma.

In prior arts sputtering systems, there is a magnetron behind sputtering target 121 to create strong plasma and lower the target voltage. The magnetron forms a narrow width closed loop electron path on the front surface 122 of the sputtering target 121 that faces vacuum side and substrate. The narrow plasma width creates a large voltage difference over small distance on the target surface 122 of the sputtering target 121 and leads to plasma arcs and particulates. The magnetron needs to be rotated to have acceptable uniformity and it is difficult to achieve good target utilization and flat target erosion. In present invention, the sputtering target 121 can be operated with or without magnetron behind. The high-density secondary plasma source 110 can provide substantially uniform strong plasma over the target surface 122 and sputter materials from the sputtering target 121 more uniformly with a DC, AC or RF bias on the sputtering target 121.

Figure 3D:
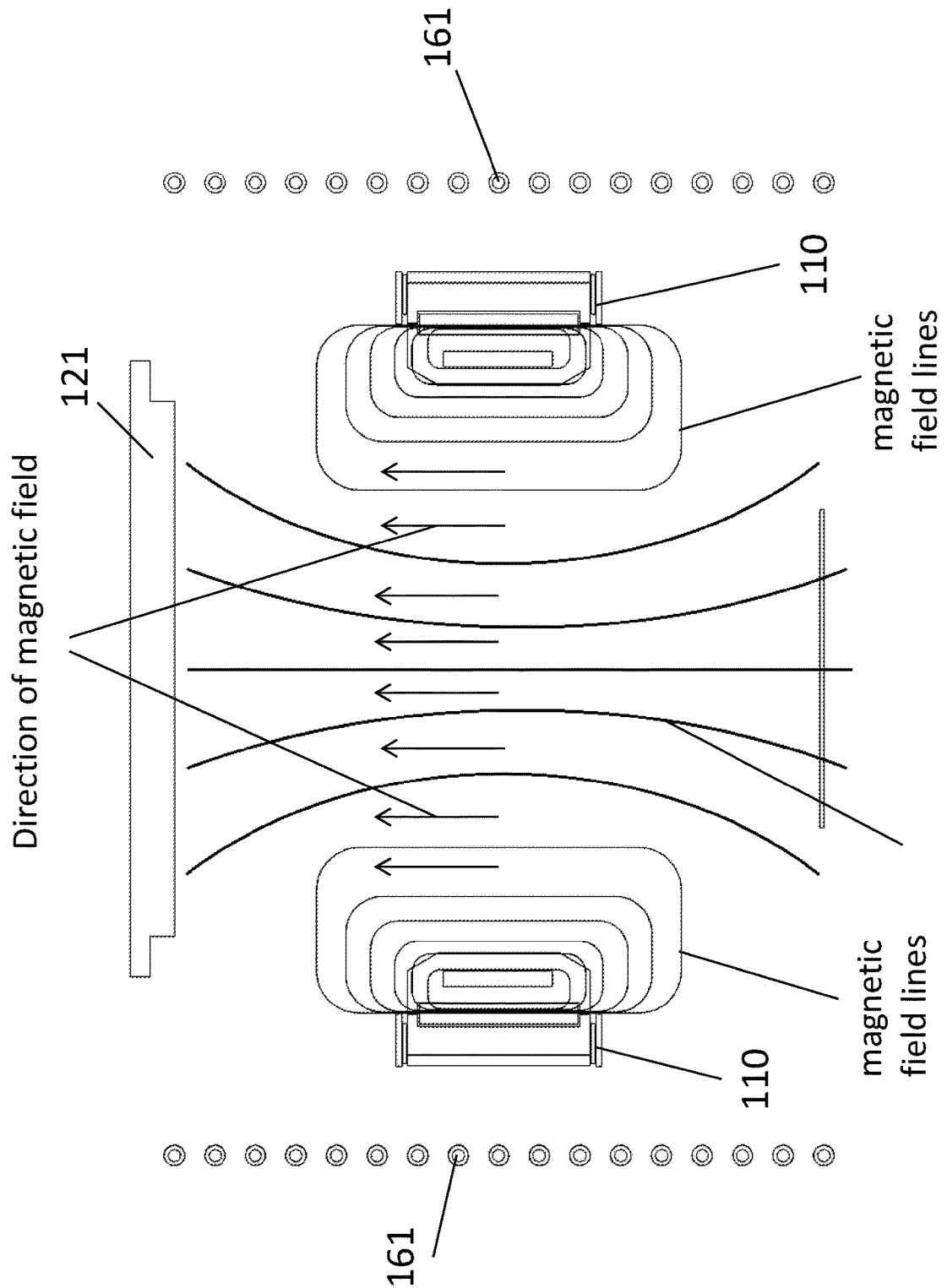
Figure 3E:
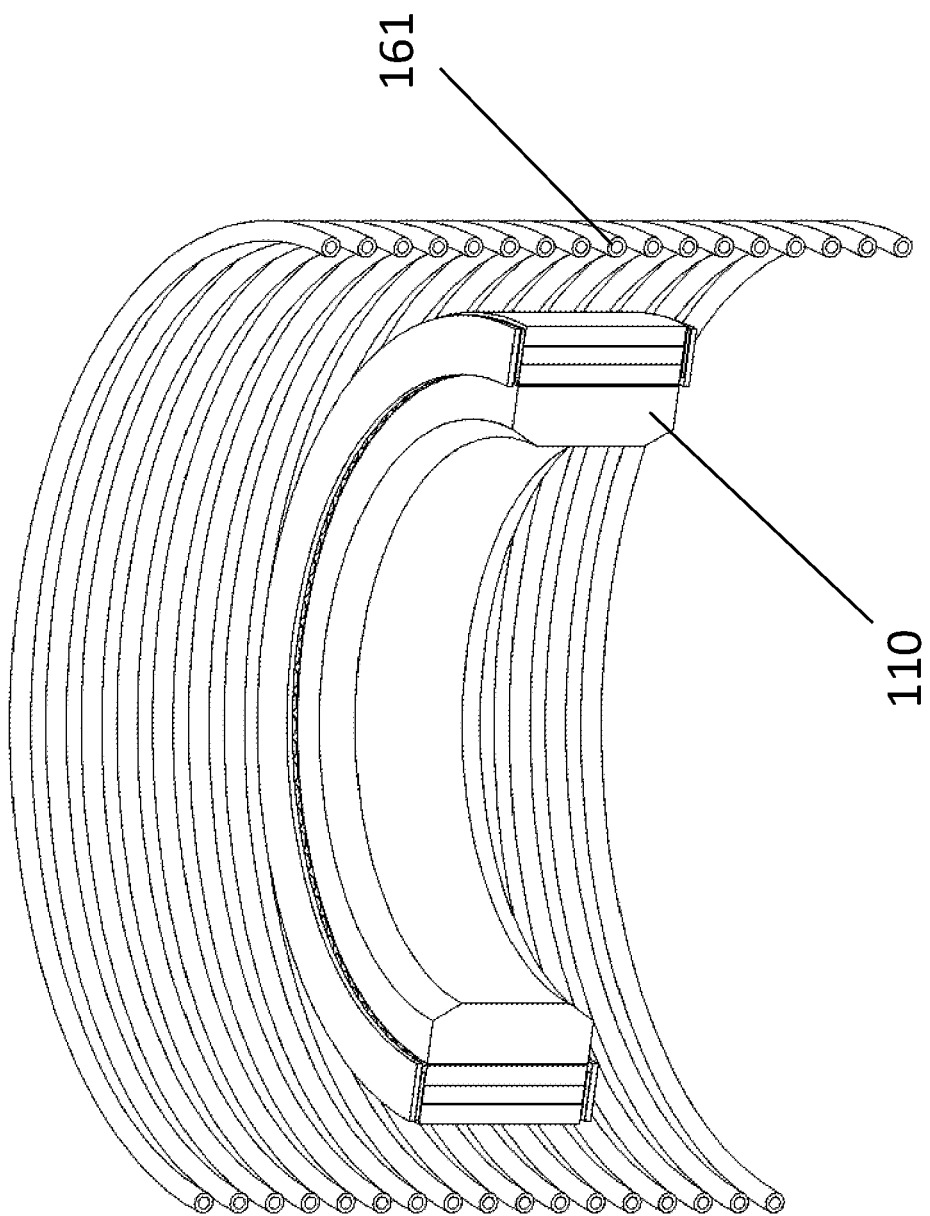
FIG. 3E is a perspective view of FIG. 3D.

The plasma follows the magnetic field and decreases as the magnetic field decreases from the cathode to the center of the process chamber, as illustrated in FIG. 3C. Additional electrical coils 161 or permanent magnets surrounding the Ionization plasma source 110 can form longer range magnetic field and extend magnetic strength into the center region of the plasma. FIGS. 3D and 3E show the set up where the electrical coils can enhance the magnetic field in the center region and improve the plasma uniformity. The electrical coil 161 can produce magnetic field in the substantially same directions as the permanent magnets 118 in the center region 150. The electrical coil 161 can increase uniformity of the magnetic field in the central region 151. The electrical coils 161 used to enhance the magnetic field can be placed outside the process chamber walls (not shown) or inside the process chamber. The coils and the three-dimensional closed-loop magnetron can generate a more uniform plasma when used together.

Electrical bias can be applied in the collimator to accelerate the ions. The acceleration voltage can be tuned. This can be done with the collimator assembly 130 in parallel to target surface 122 or tilted relative to target surface 122.

Figure 2A:
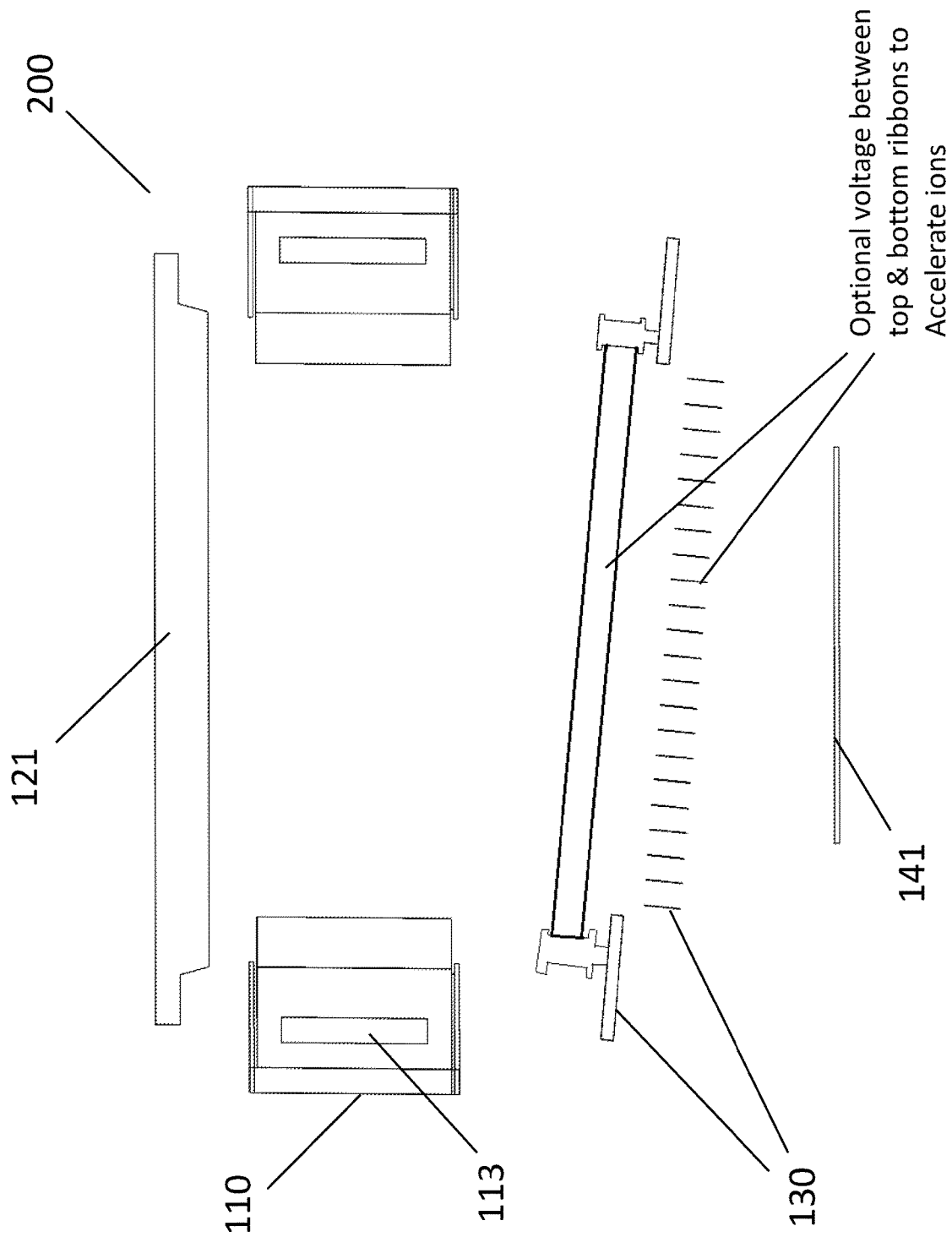
FIG. 2A is a sectional view of a plasma deposition apparatus that includes a substrate being deposited by sputtering target, three-dimensional closed loop magnetron source as secondary plasma sources, and a collimator in accordance with the present invention. The collimator is tilted to allow the collimated beam to exit at an angle from the center axis.
Figure 2B:
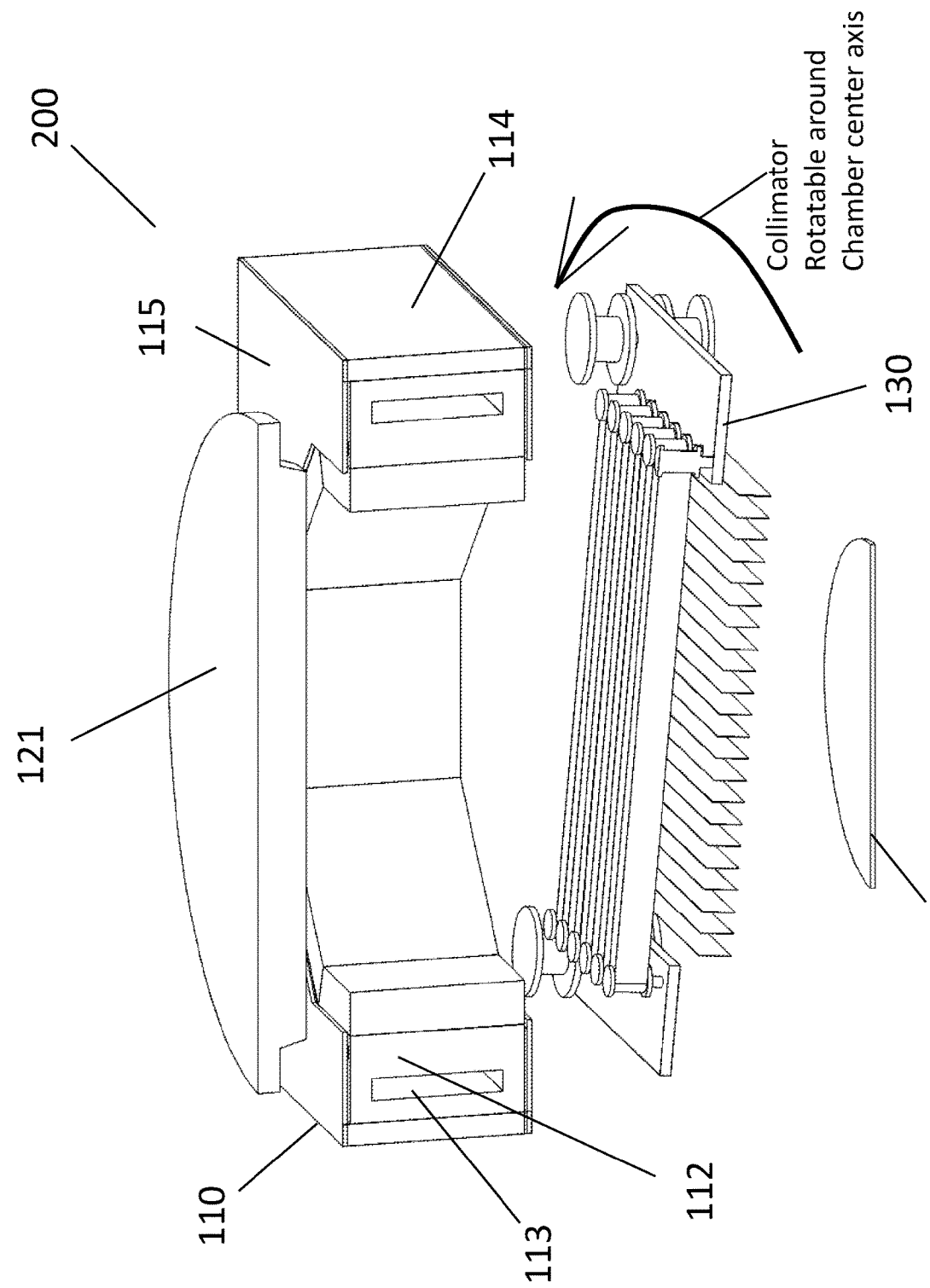
FIG. 2B is a perspective sectional view of FIG. 2A. The collimator can rotate around the center axis to improve deposition uniformity.

In FIGS. 2A-2B, a plasma deposition apparatus 200 includes similar components as those disclosed above in a plasma deposition apparatus 100. The collimator is tilted relative to the center axis of the substrate. This will create a tilted beam relative to the center axis. The tilted beam can preferentially deposit more materials on sidewalls than the bottom of trenches. The whole collimator can also rotate around the center axis to reach uniformity. In one special case, the deposition can be done in discrete collimator rotation angles to align the deposition beam direction with the trenches on the substrate and enhance the deposition on the walls of the trenches. There may be more ways to tilt the ions and atoms that pass through the collimator, such as tilting the individual walls of the collimator. The substrate can also be rotated along its center axis while the collimator is stationary to achieve deposition uniformity.

Figure 2C:
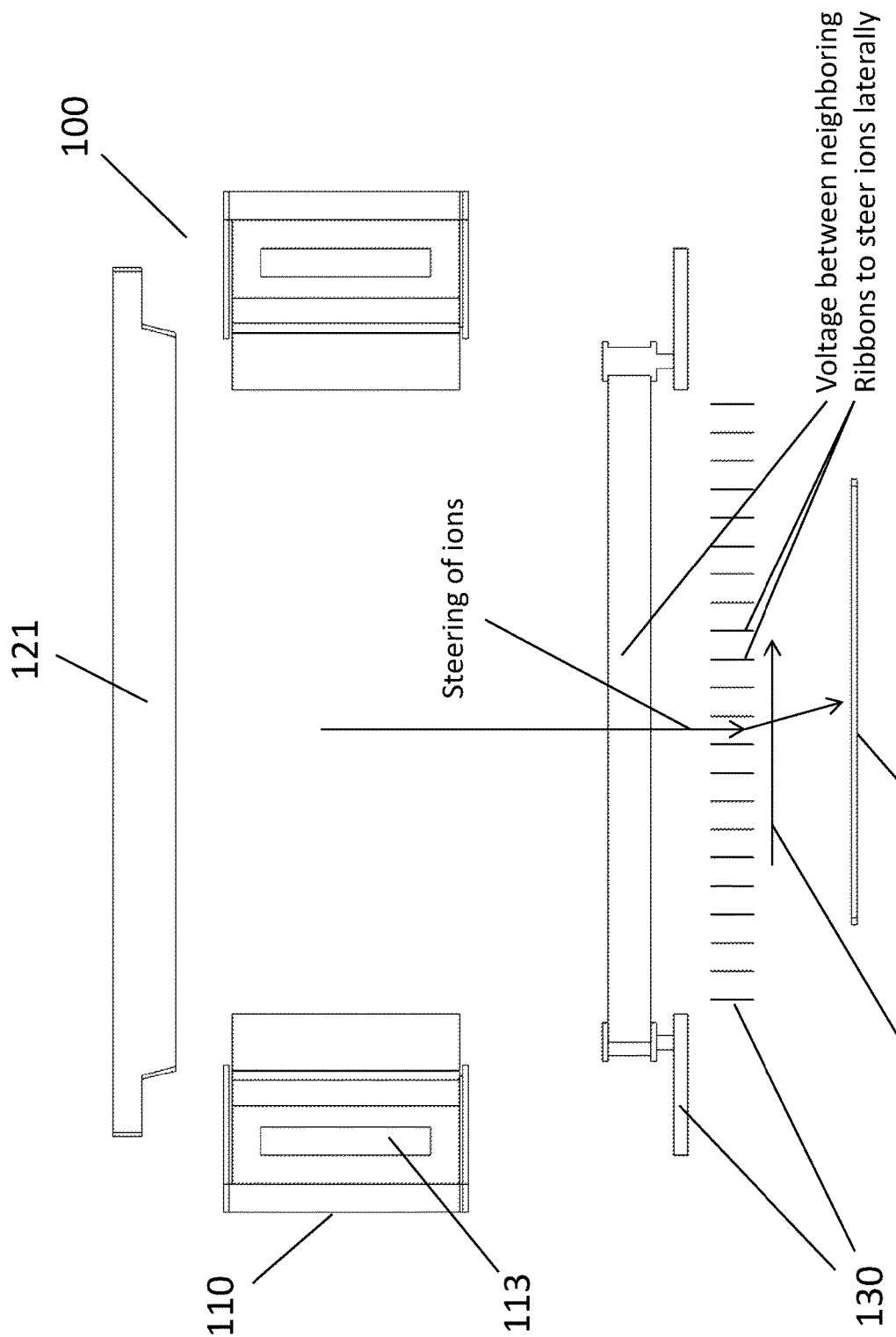
FIG. 2C shows each web or wall in a collimator is electrically biased to steer the ions and tilt the ion beam.

Another method to tilt the ion beam compatible with plasma deposition apparatus 100 and 200 described above is to apply bias voltage between neighboring walls in the collimator, as shown in FIG. 2C. The ions that pass through the collimator will gain lateral velocity and arrive at the substrate at an angle. With two layers of webs or walls in a collimator, it is possible to steer the ion beam in all directions and achieve deposition uniformity without physically moving the collimator. One way to apply bias between neighboring ribbons or webs is to use electrically insulating ribbons or webs and coat them with conductive target materials after they are advanced into position. Since the rollers 135 and ribbons near the rollers 135 can be shielded from deposition, different voltage can be applied to the ribbons or webs without shorting them electrically. The rollers 135 and the tension and driving wheels 134 are mounted to plate 131.

The collimator can be electrically biased relative to the ground, the plasma source, and/or the substrate to manipulate the ions and align the ions. The collimator can be made of at least two electrically isolated parts; an electrical bias is placed between these two parts to accelerate, focus, and to add lateral velocity to the ions. The bias voltage and the tilt angle change the lateral velocity, while the bias on substrate determines the vertical velocity of the ions to control the angle of the arrival for the deposition ion. The ion angle should be optimized to match the aspect ratio and slope of trenches and via. For example, the angles of the sputtered ions should just reach the lower corner of the trenches or via to minimize deposition on the bottom while maximizing the deposition on the sidewalls of trench and via and avoid non-uniform deposition along the side walls. The substrate can be biased, grounded or float, with optional electron emission devices to neutralize the charges on the substrate.

The placement of collimator will also create a pressure differential between upper chamber and the space below the collimator and above the substrate when process gases are flown in between the sputtering target 121 and the collimator assembly 130, further reducing the pressure and ion collisions with gas molecules in the process chamber after or during the final acceleration of ions towards substrate. The less collisions lead to more aligned ion beams.

Figure 1C:
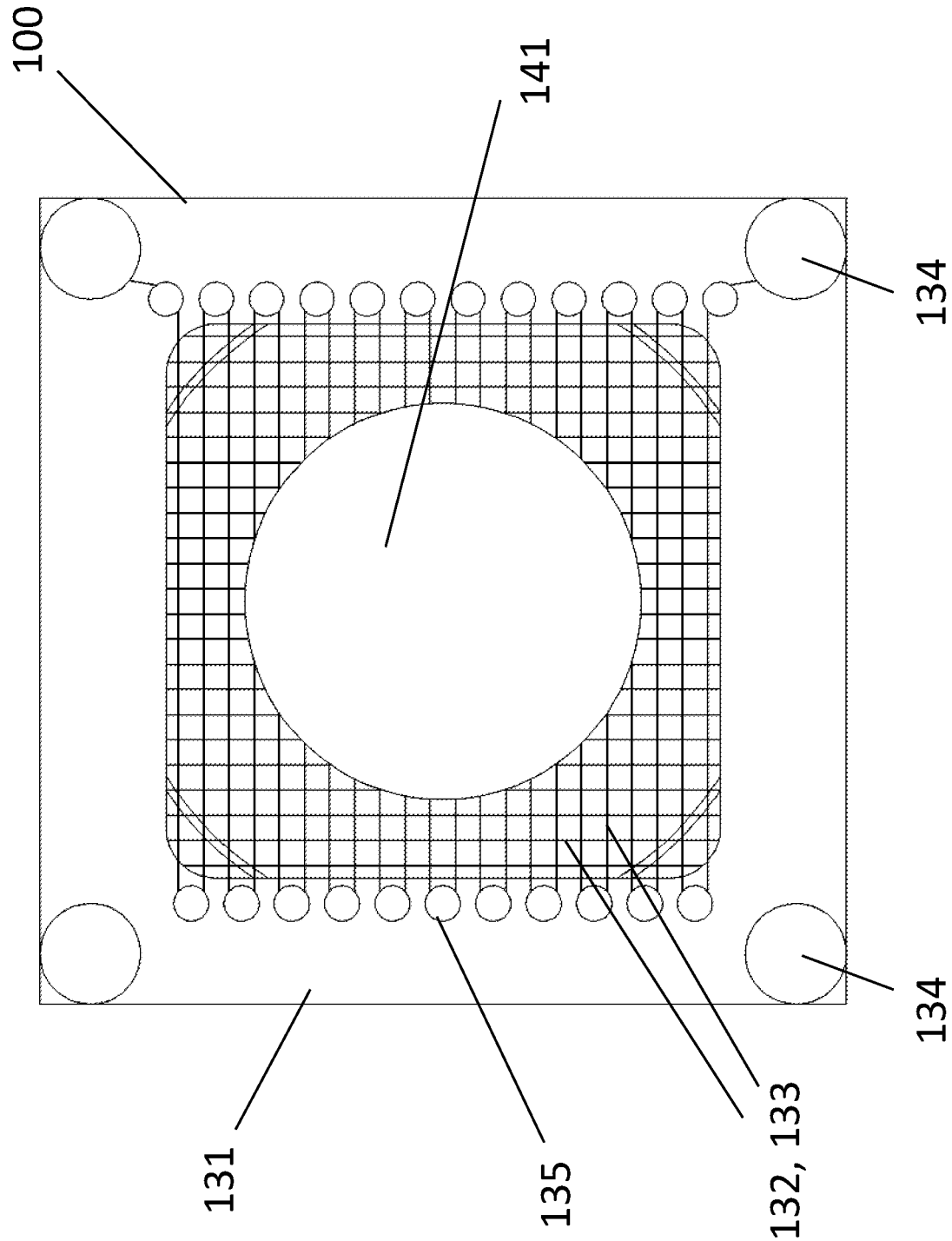
FIG. 1C is the view of collimator grid viewed from the direction normal to the substrate in accordance with some embodiments of the present invention.

The collimator can be made of movable material to avoid excess deposition and particulates formation. Multiple ribbons or webs 132 and 133 are winding through rollers 135 to form parallel walls and form rectangle or polygon shaped grids when viewed from the substrate, as illustrated in FIG. 1C. The web thickness can be as thin as a few microns to minimize shadows of deposition on the substrate. The conventional collimator wall thickness is typically hundreds of microns to maintain the mechanical strength, the large wall thickness of the prior arts collimator blocks more deposition material and sometimes leaves images on substrate. By moving the webs at a constant rate relative to deposition rate, the average thickness of the web can be maintained constant throughout the entire lifetime to avoid the process drift seen in conventional collimator. Alternatively, the ribbons 132 and 133 can be moved at once to form all fresh collimator walls, and the procedure is repeated after enough deposition on the collimator. The much-reduced deposition on the collimator ribbons 132 and 133 reduce particulates.

Figure 1D:
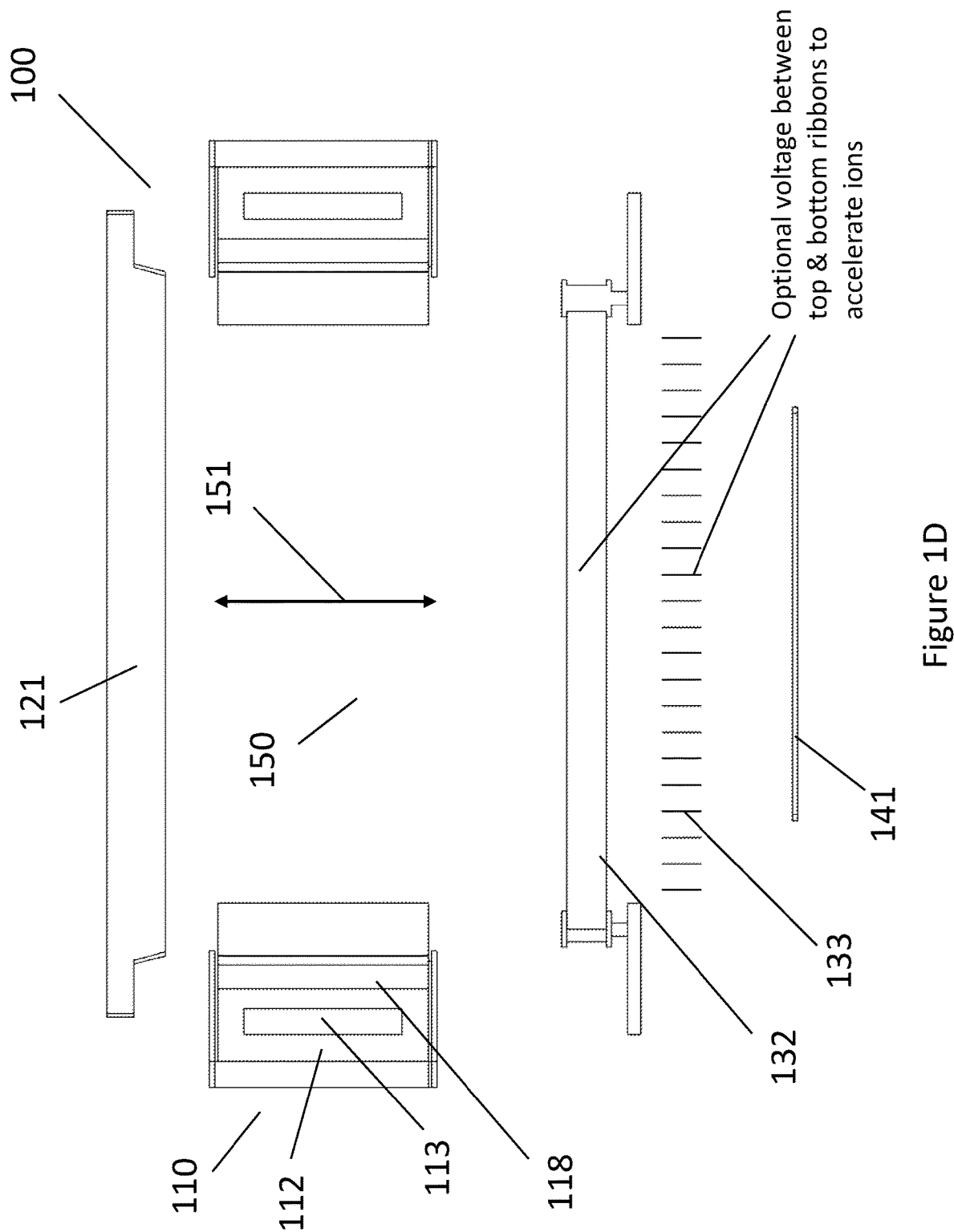
FIG. 1D is a cross-sectional view of the plasma deposition apparatus shown in FIG. 1A.

For some applications, electro-static chucks (ESC or E-chuck) are powered by RF power to induce a voltage called self-bias voltage; this voltage requires plasma near the substrate to have a net DC bias and the DC bias may be high due to the high power needed for process equipment throughput, low plasma density near the substrate, or geometry of various electrodes near the substrate. The disclosed collimator system can apply an accelerating voltage to the ions and direct the ions toward the substrate. The energy of the ions can be controlled by an external power supply and can range from zero to any voltage. FIG. 1D shows the bias between the two parts of collimator can be varied, FIG. 2C shows the accelerating voltage can be applied between various plates. Optional electron source can emit electrons and neutralize the accumulated ions on the substrate to prevent charge up on the substrate. For example, hot filament coated with high electron emission efficiency materials can be heated to emit electrons and neutralize the charge up on the substrate. This method improves the control of the ion energy and enables low energy ions at substrate and eliminates many limitations of the electro-static chuck.

Figure 1E:
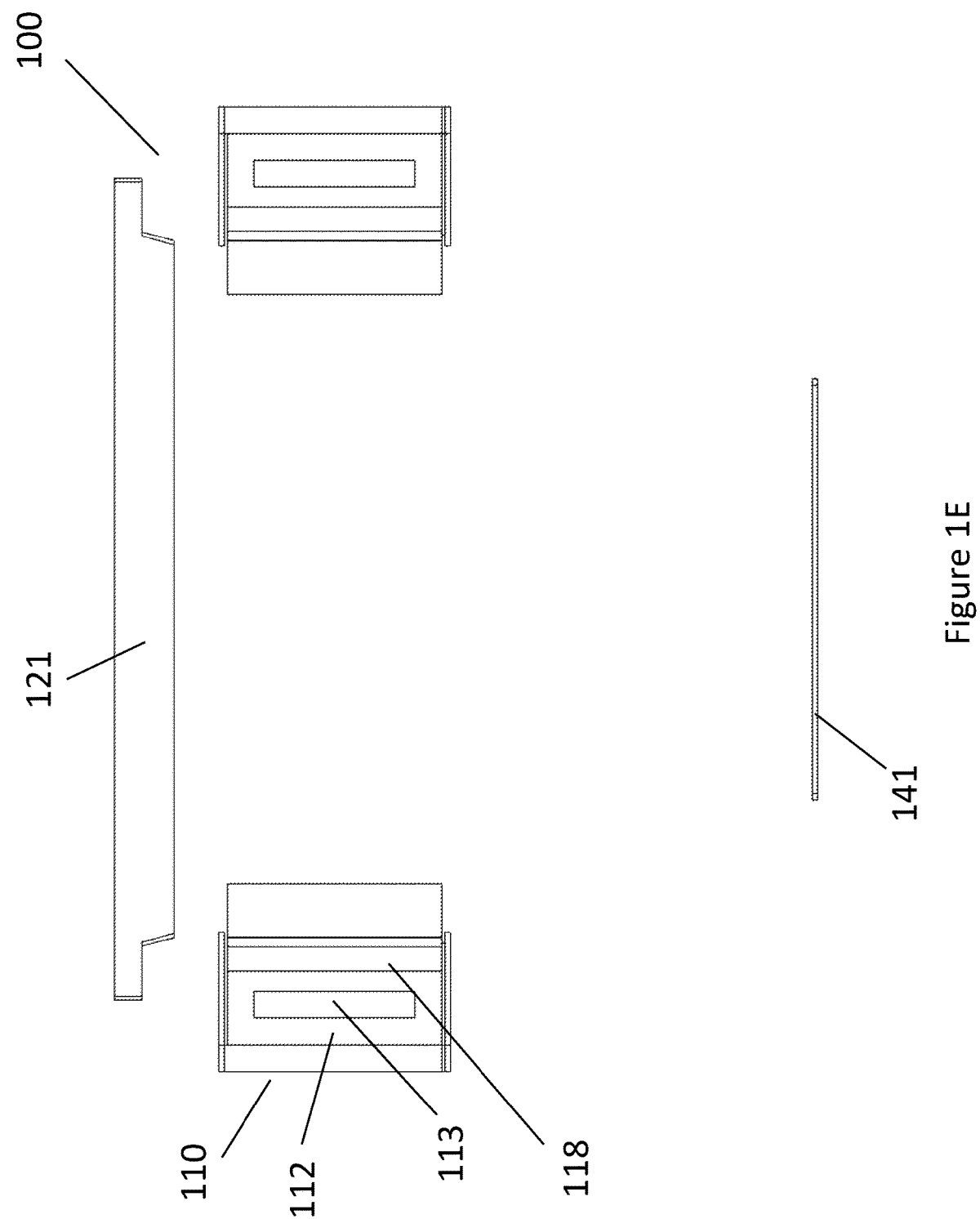
FIG. 1E is a cross-sectional view of the plasma deposition apparatus similar to FIG. 1D without collimator assembly in accordance with some embodiments of the present invention.

The collimator assembly in present invention can limit the angles of depositing atoms or ions and allows better step coverage or bottom coverage. The collimator assembly may not be needed for some applications. The plasma density of the three-dimensional closed loop magnetron is much higher than conventional ionization sources such as inductive coil or dome shaped target. The disclosed secondary plasma source 110 in FIGS. 1A to 1E may fully ionize all or most atoms sputtered off the sputtering target 121 and greatly reduce the large off-angle depositions without collimator assembly. FIG. 1E illustrates the deposition chamber with high efficiency plasma source and without use of collimator assembly.

There are prior arts that use inductive coils to ionize sputtered atoms, they are less efficient and require higher operating pressure. The coils can have a high voltage and are sputtered by the plasma.

There are prior arts that a dome shaped sputtering target is used, and the side surface of the sputtering target is part of plasma generating source. These side surfaces contribute to off angle sputtered atoms to the substrate. They do not have independent power control and may let neutral sputtered atoms through and deposited on substrate. The magnets' placement is limited to outside the target diameter, making it less efficient in plasma confinement.

Referring to FIG. 4, a secondary plasma source 450 is disposed between a collimator 430 and a substrate 441 to create plasma below collimator 430 to enable the formation of self-bias voltage on substrate 441, and to generate electrons and to neutralize the depositing ions, or to neutralize substrate 441 to avoid charge buildup on the substrate 441, as shown in FIG. 4. The three-dimensional closed loop magnet confined plasma source 450 is the additional plasma source. The additional plasma source 450 can also be inductive coil, closed loop magnetron as shown in FIG. 4, microwave, electron cyclotron resonance (ECR), or other apparatus. The self-bias voltage on the substrate can be controlled by the power applied to additional plasma source 450; a higher plasma density will result in lower self-bias voltage at substrate.

Figure 1F:
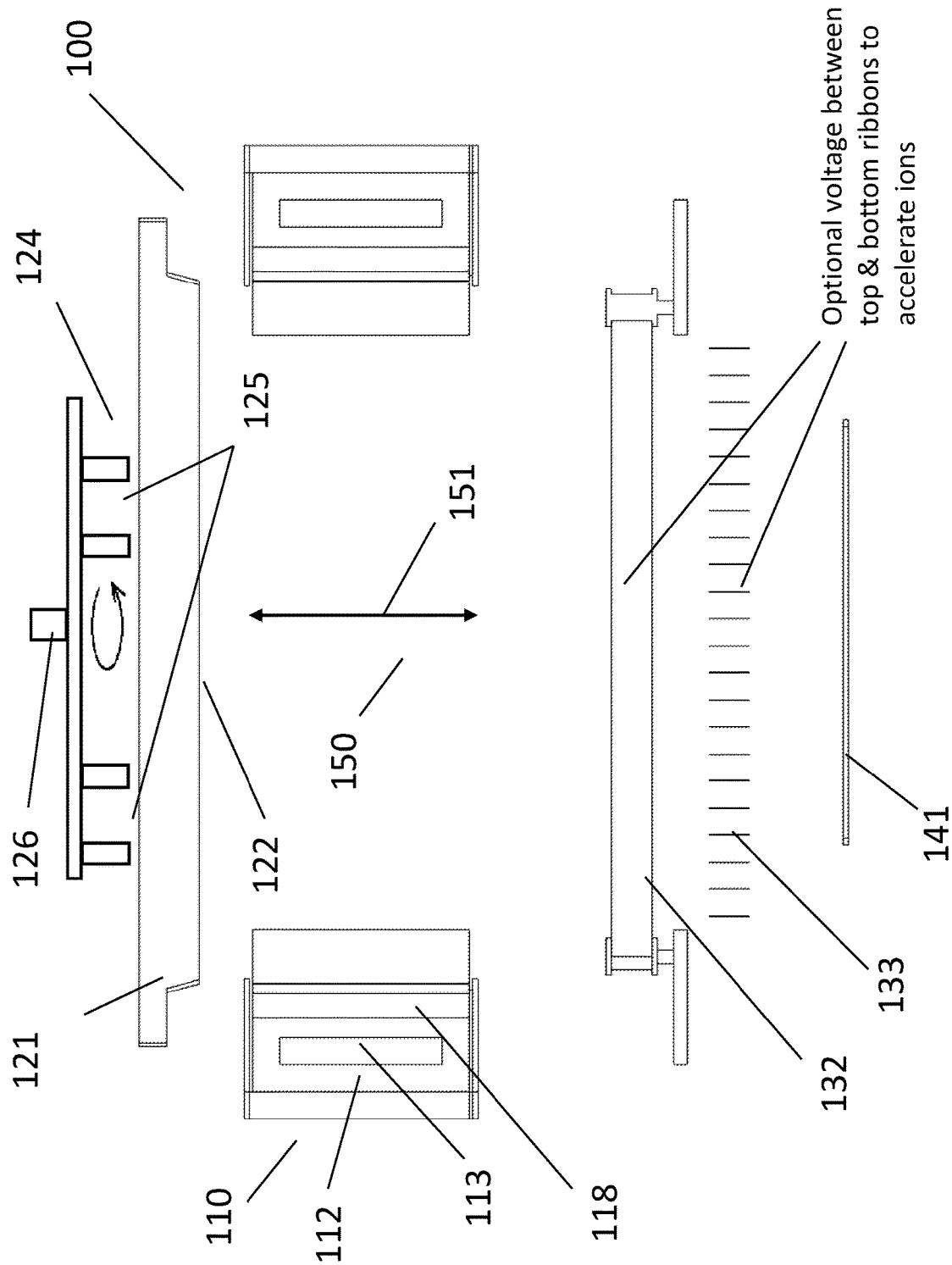
FIG. 1F is a cross-sectional view of the plasma deposition apparatus similar to FIG. 1D with a conventional closed loop magnetron above the sputtering target, with optional rotation mechanism in accordance with some embodiments of the present invention.

There can be traditional 2-dimensional closed-loop magnetron 124 behind the sputtering target backside, away from the side of the sputtering target 122 that faces the substrate as shown in FIG. 1F. The magnetron 124 forms a closed-loop magnetic field path 125 and can confine electrons to a closed-loop narrow path on sputtering target surface 122 and form plasma at low pressure. A rotation mechanism 126 can rotate the magnetron 124 around the center axis of sputtering target 121 to improve plasma and deposition uniformity. The plasma source 110 is optional to maintain the plasma and sputter the sputtering target 121. The plasma source 110 increases the plasma density and ionization of sputtered atoms and improves the sputtering rate uniformity on the sputtering target surface 122.

Figure 1G:
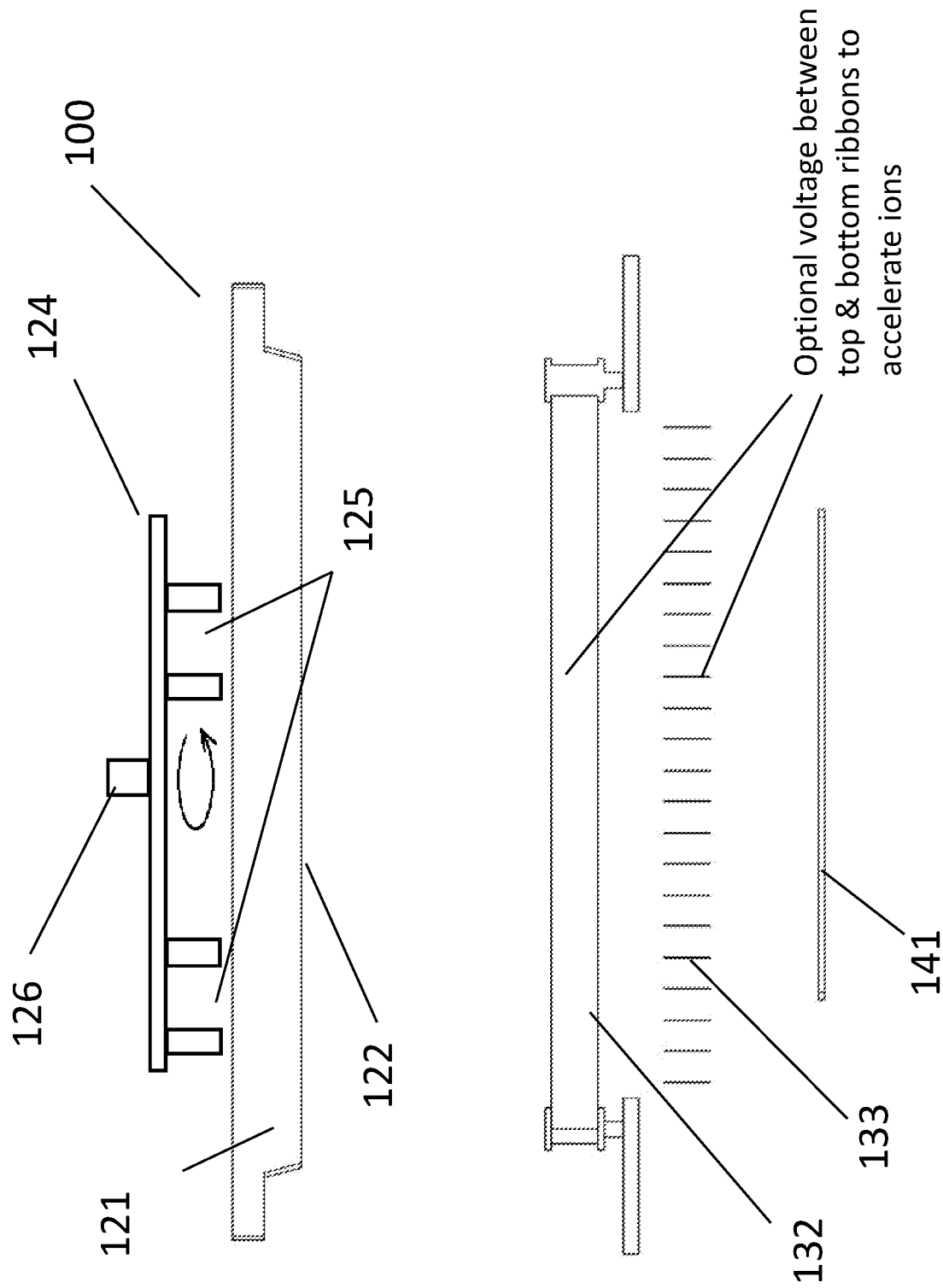
FIG. 1G is a cross-sectional view of the plasma deposition apparatus similar to FIG. 1F with a conventional closed loop magnetron above the sputtering target, with optional rotation mechanism, but without the secondary plasma source in accordance with some embodiments of the present invention.

In the disclosed collimator 130, the ribbons 132 and 133 can be moved by a transport mechanism to improve lifetime, less process drift, and lower particulates. FIG. 1G shows such configuration.

The invention claimed is:
1. A plasma deposition apparatus, comprising:
   a first plasma source configured to produce a plasma confined in a magnetic field, comprising:
      a closed-loop electrode defining a center region therein and a central axis through the central region; and one or more magnets that are outside an inner surface of the closed-loop electrode, wherein the one or more magnets are configured to produce the magnetic field in the center region, wherein the closed-loop electrode and the one or more magnets are configured to produce a plasma of ions to sputter atoms off a sputtering target or a backing plate; and a collimator, comprising:

a first set of parallel ribbons;

a first transport mechanism configured to move the first set of the parallel ribbons to expose clean portions of the first set of parallel ribbons to the atoms and ions produced from the sputtering target;

a second set of parallel ribbons, wherein the second set of parallel ribbons is displaced from the first set of parallel ribbons along the central axis, wherein the first set of parallel ribbons and the second set of parallel ribbons are crossed at a substantial angle; and a second transport mechanism configured to move the second set of the parallel ribbons to expose clean portions of the second set of parallel ribbons to the atoms and ions produced from the sputtering target, wherein the first set of parallel ribbons and the second set of parallel ribbons are configured to collimate the atoms and ions produced by the first plasma source and to direct the atoms and the ions to a substrate.

2. The plasma deposition apparatus of claim 1, wherein the closed-loop electrode has a circular shape or a polygon shape.

3. The plasma deposition apparatus of claim 1, wherein the first plasma source is disposed between the sputtering target and the substrate, the plasma deposition apparatus further comprising:

a magnetron positioned adjacent to a side of the sputtering target away from the substrate.

4. The plasma deposition apparatus of claim 3, wherein the magnetron is configured to be rotated by a rotation mechanism.

5. The plasma deposition apparatus of claim 1, wherein the one or more magnets are positioned in a circle in the closed-loop electrode.

6. The plasma deposition apparatus of claim 1, wherein the one or more magnets are fully embedded in the closed-loop electrode.

7. The plasma deposition apparatus of claim 1, wherein the one or more magnets are partially embedded in the closed-loop electrode.

8. The plasma deposition apparatus of claim 1, wherein the sputtering target is electrically biased relative to ground.

9. The plasma deposition apparatus of claim 1, wherein the first set of parallel ribbons and the second set of parallel ribbons are crossed substantially at an orthogonal angle.

10. The plasma deposition apparatus of claim 1, wherein the first set of parallel ribbons and the second set of parallel ribbons are electrically biased relative to each other to steer the ions.

11. The plasma deposition apparatus of claim 1, wherein neighboring ribbons in the first set of parallel ribbons and the second set of parallel ribbons are electrically biased relative to each other to steer the ions.

12. The plasma deposition apparatus of claim 1, wherein the first plasma source is disposed between the sputtering target and the substrate, wherein the collimator is disposed between the first plasma source and the substrate.

13. The plasma deposition apparatus of claim 1, wherein the first set of parallel ribbons are moveable by a first transport mechanism.

14. The plasma deposition apparatus of claim 1, wherein the second set of parallel ribbons are moveable by a second transport mechanism.

15. The plasma deposition apparatus of claim 1, wherein the first set of parallel ribbons having surfaces substantially parallel to the central axis, wherein a second set of parallel ribbons having surfaces substantially parallel to the central axis.

16. The plasma deposition apparatus of claim 1, wherein the first set of parallel ribbons and the second set of parallel ribbons are rotatable around the central axis.

17. The plasma deposition apparatus of claim 1, wherein the first plasma source further comprises:

an electrical coil configured to increase uniformity of the magnetic field in the center region.

18. The plasma deposition apparatus of claim 1, further comprising:

a second plasma source disposed between the collimator and the substrate, configured to neutralize ions in the first plasma.

19. A plasma deposition apparatus, comprising:

a sputtering target or a backing plate configured to produce sputtered atoms and ions; and a collimator, comprising:

a first set of parallel ribbons;

a first transport mechanism configured to move the first set of the parallel ribbons to expose clean portions of the first set of parallel ribbons to the sputtered atoms and ions;

a second set of parallel ribbons, wherein the second set of parallel ribbons is displaced from the first set of parallel ribbons, wherein the first set of parallel ribbons and the second set of parallel ribbons are crossed at a substantial angle; and a second transport mechanism configured to move the second set of the parallel ribbons to expose clean portions of the second set of parallel ribbons to the sputtered atoms and ions, wherein the first set of parallel ribbons and the second set of parallel ribbons are configured to collimate the atoms and ions and to direct the sputtered atoms and ions to a substrate.

\* \* \* \* \*